US012787220B2

(12) United States Patent
Xiao et al.

(10) Patent No.: US 12,787,220 B2
(45) Date of Patent: Nov. 3, 2026

(54) WATER-COOLING HEAD STRUCTURE CAPABLE OF GUIDING LEAKAGE CURRENT AND WATER-COOLING DEVICE THEREOF

(71) Applicant: APALTEK CO., LTD., Shenzhen (CN)

(72) Inventors: Qineng Xiao, Dongguan (CN); Dagao Zheng, Shenzhen (CN)

(73) Assignee: APALTEK CO., LTD., Shenzhen (CN)

( * ) Notice: Subject to any disclaimer, the term of this patent is extended or adjusted under 35 U.S.C. 154(b) by 122 days.

(21) Appl. No.: 18/894,730

(22) Filed: Sep. 24, 2024

(65) Prior Publication Data

US 2026/0047042 A1 Feb. 12, 2026

(30) Foreign Application Priority Data

Aug. 12, 2024 (CN) ........................ 202411102664.9

(51) Int. Cl.
*H05K 7/20* (2006.01)

(52) U.S. Cl.
CPC ................................ *H05K 7/20272* (2013.01)

(58) Field of Classification Search
CPC . H05K 7/20272; H05K 9/0064; H05K 1/0215
See application file for complete search history.

(56) References Cited

U.S. PATENT DOCUMENTS

| | | | | | |
|---|---|---|---|---|---|
| 5,680,297 | A * | 10/1997 | Price | G06F 1/182 361/753 |
| 2012/0061057 | A1* | 3/2012 | Okano | G03G 21/20 165/104.31 |
| 2018/0110160 | A1* | 4/2018 | Wakayama | H05K 9/0064 |
| 2019/0339026 | A1* | 11/2019 | Chen | F04D 29/5893 |
| 2020/0096849 | A1* | 3/2020 | Iyoda | H04N 9/3144 |
| 2021/0293491 | A1* | 9/2021 | Cai | F28D 1/05375 |
| 2022/0082438 | A1* | 3/2022 | Saito | H05K 9/0064 |
| 2023/0008735 | A1* | 1/2023 | Tamaoka | H05K 7/20254 |
| 2023/0292477 | A1* | 9/2023 | Park | H02B 1/56 |
| 2023/0396016 | A1* | 12/2023 | König | G06F 1/20 |
| 2024/0194617 | A1* | 6/2024 | Yamakaji | H05K 9/0064 |

* cited by examiner

*Primary Examiner* — Travis Ruby
(74) *Attorney, Agent, or Firm* — HDLS IPR SERVICES; Chun-Ming Shih

(57) ABSTRACT

A water-cooling head structure capable of guiding a leakage current and a water-cooling device thereof are provided. The water-cooling head structure includes a water-cooling head and a ground cable set. The water-cooling head includes a metal base plate and an accommodation space recessed from the metal base plate. A plurality of fins is arranged in the accommodation space. A waterproof layer is arranged on the metal base plate to cover the accommodation space and the fins. The ground cable set includes a ground plug and a ground cable electrically connected to each other. The ground cable contacts the water-cooling head. The ground plug is used for ground. Accordingly, the water-cooling head structure is able to transfer a leakage current generated by the water-cooling head to a system circuit, such as a mainboard board, in order to eliminate a residual electrical charge via ground.

11 Claims, 5 Drawing Sheets

WATER-COOLING HEAD STRUCTURE CAPABLE OF GUIDING LEAKAGE CURRENT AND WATER-COOLING DEVICE THEREOF

BACKGROUND OF THE DISCLOSURE

Technical Field

The present disclosure relates to a water-cooling heat sink, and in particular, to a water-cooling head structure capable of guiding a leakage current and a water-cooling device thereof.

Description of Related Art

When a currently existing water-cooling system is applied to a semiconductor electronic heat generating component, such as CPU, the water-cooling head is attached to the electronic heat generating component for cooling. However, after the electronic heat generating component is electrically connected to a mainboard, current leakage of the internal transistor may occur due to the design of the electronic heat generating component. In addition, when current leakage of the electronic heat generating component occurs, it may be conducted to the copper base plate of the water-cooling head to cause electrode polarization of the water-cooling head, such that the cooling liquid in the water-cooling head is likely to undergo electrochemical reaction, resulting in the generation of impurities in the cooling liquid. Furthermore, as the cooling liquid continues to circulate inside the pipeline of the water-cooling system, pipeline jamming due to the impurities may occur, and the cooling effect of the water-cooling system may even be affected.

In view of the above, the inventor seeks to improve and overcome the aforementioned drawbacks and proposes a reasonable design capable of effectively improving the aforementioned drawbacks after extensive research along with the utilization of academic principles.

SUMMARY OF THE INVENTION

A primary objective of the present disclosure is to provide a water-cooling head structure capable of guiding a leakage current and water-cooling device thereof. The present disclosure is able to transfer the leakage current generated on the water-cooling head to a system circuit, such as a mainboard, to eliminate residual electrical charge, to prevent electrochemical reaction of the cooling liquid inside the water-cooling head and to prevent unnecessary generation of impurities in the cooling liquid that may affect the normal operation of the water-cooling system.

To achieve the aforementioned objective, the present disclosure provides a water-cooling head structure capable of guiding a leakage current having a water-cooling head and a ground cable set. The water-cooling head includes a metal base plate, the metal base plate includes an accommodation space recessed therefrom, and a plurality of fins are arranged at the accommodation space. In addition, the metal base plate includes a waterproof layer covered onto the accommodation space and the plurality of fins. The ground cable set includes a ground plug and a ground cable, and the ground cable is electrically connected to the ground plug. Furthermore, the ground cable contacts the water-cooling head, and the ground plug is electrically connected to ground.

To achieve the aforementioned objective, the present disclosure provides a water-cooling device having a water-cooling head, a ground cable set and a radiator. The water-cooling head includes a metal base plate, the metal base plate includes an accommodation space recessed therefrom, and a plurality of fins are arranged at the accommodation space. In addition, the metal base plate includes a waterproof layer covered onto the accommodation space and the plurality of fins. The ground cable set includes a ground plug and a ground cable, and the ground cable is electrically connected to the ground plug. The radiator includes two pipelines connected between the radiator and the water-cooling head. Furthermore, the ground cable contacts the water-cooling head, and the ground plug is electrically connected to ground.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
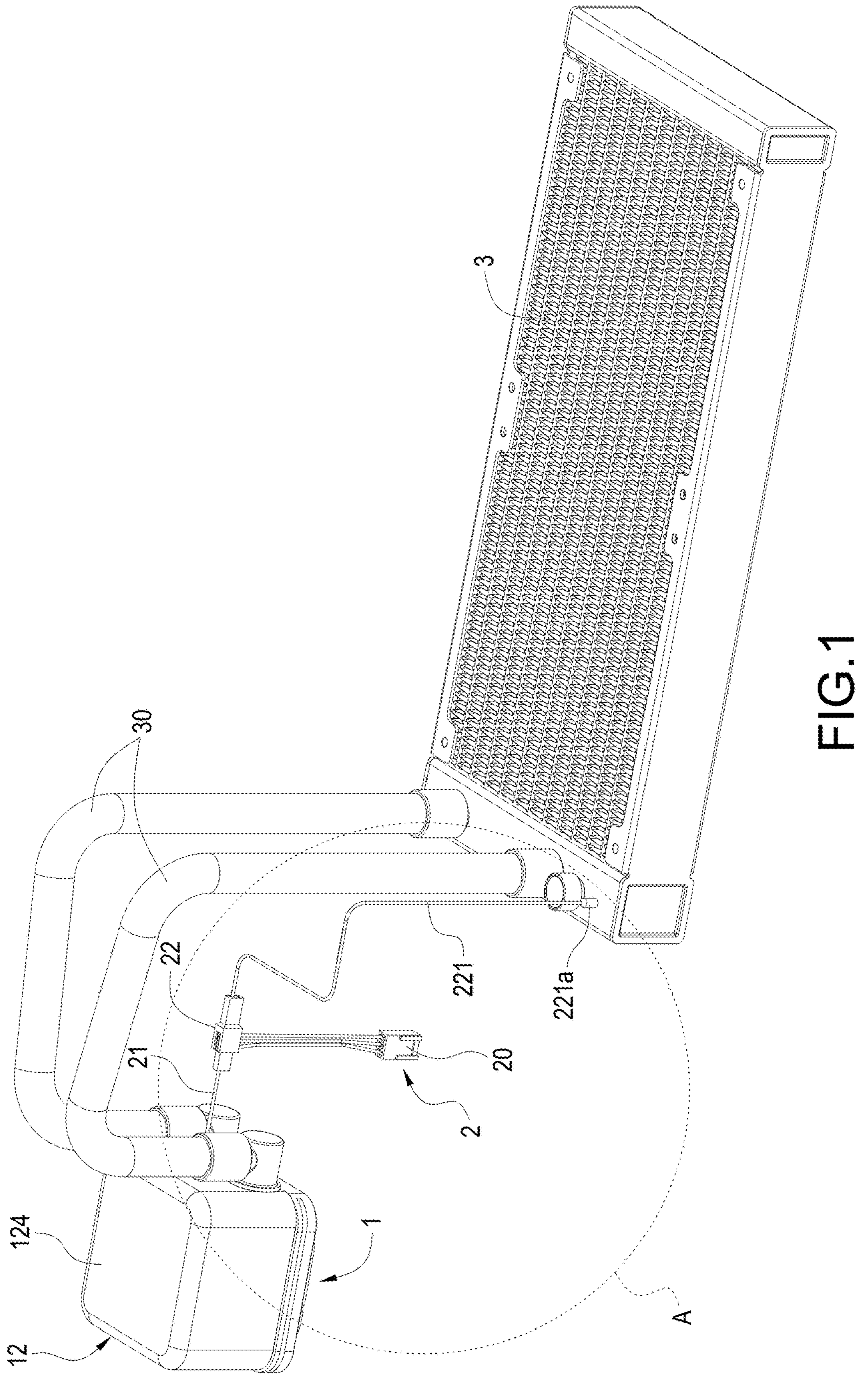
FIG. 1 is a perspective view of the present disclosure applied to a water-cooling device.
Figure 2:
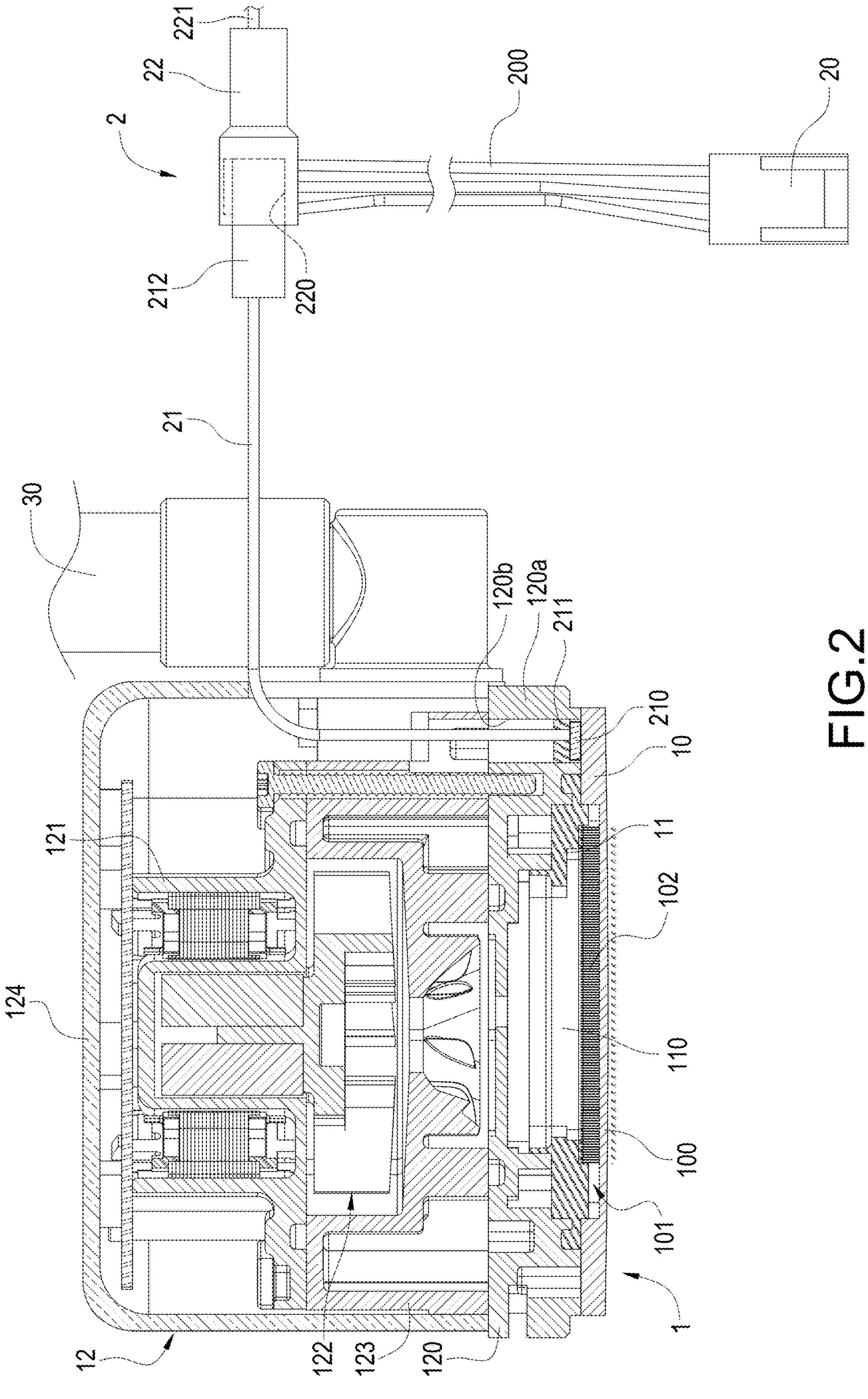
FIG. 2 is a partially cross sectional view of the present disclosure.
Figure 3:
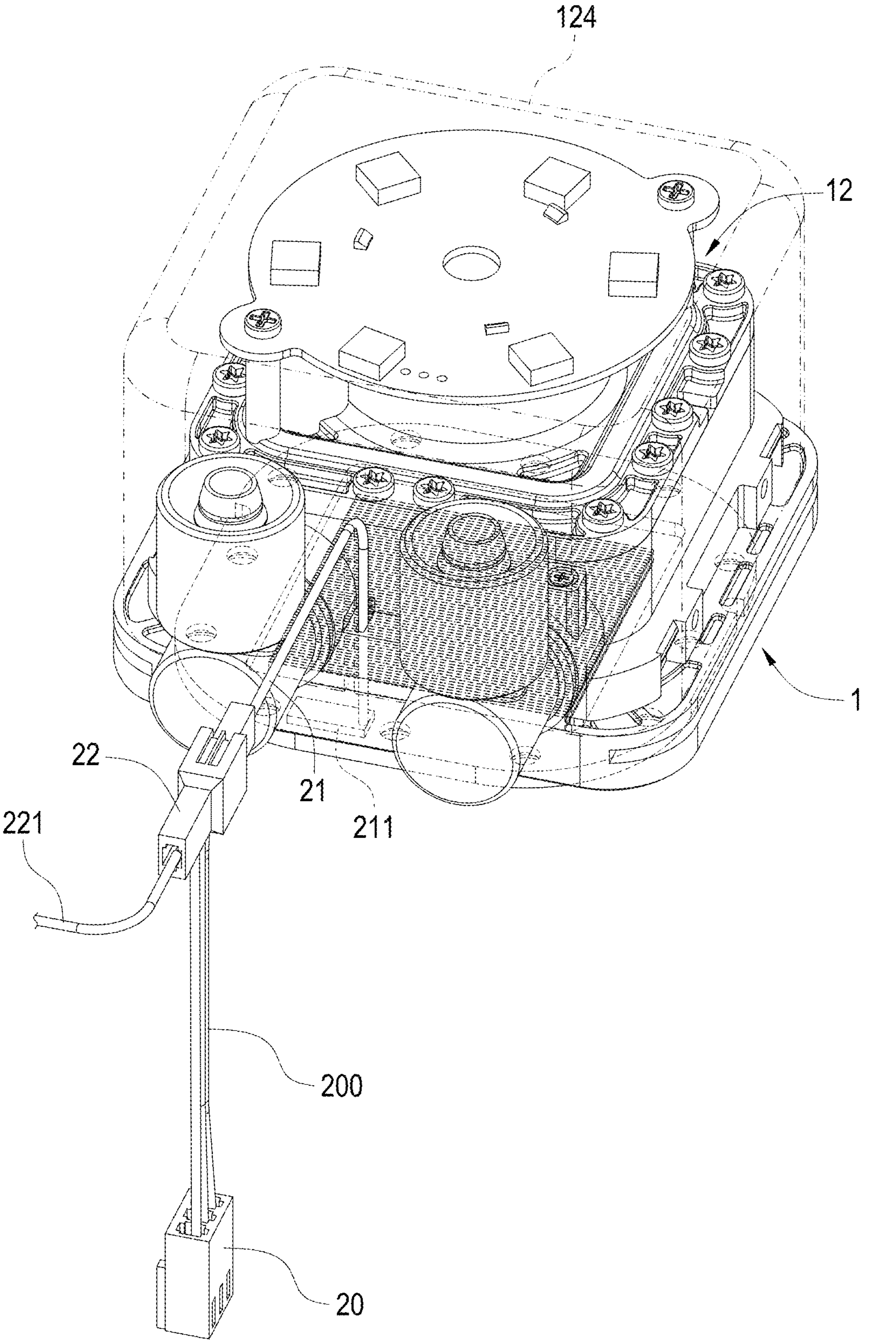
FIG. 3 is a partially perspective view of the present disclosure.

Please refer to FIG. 1, FIG. 2 and FIG. 3, showing a perspective view of the present disclosure applied to a water-cooling device, a partially cross sectional view and a partially perspective view of the present disclosure. The present disclosure provides a water-cooling head structure capable of guiding a leakage current and water-cooling device thereof. The water-cooling head structure includes a water-cooling head 1 and a ground cable set 2. The water cooling device further includes a radiator 3 and two pipelines 30 connected between the water-cooling head 1 and the radiator 3.

Figure 5:
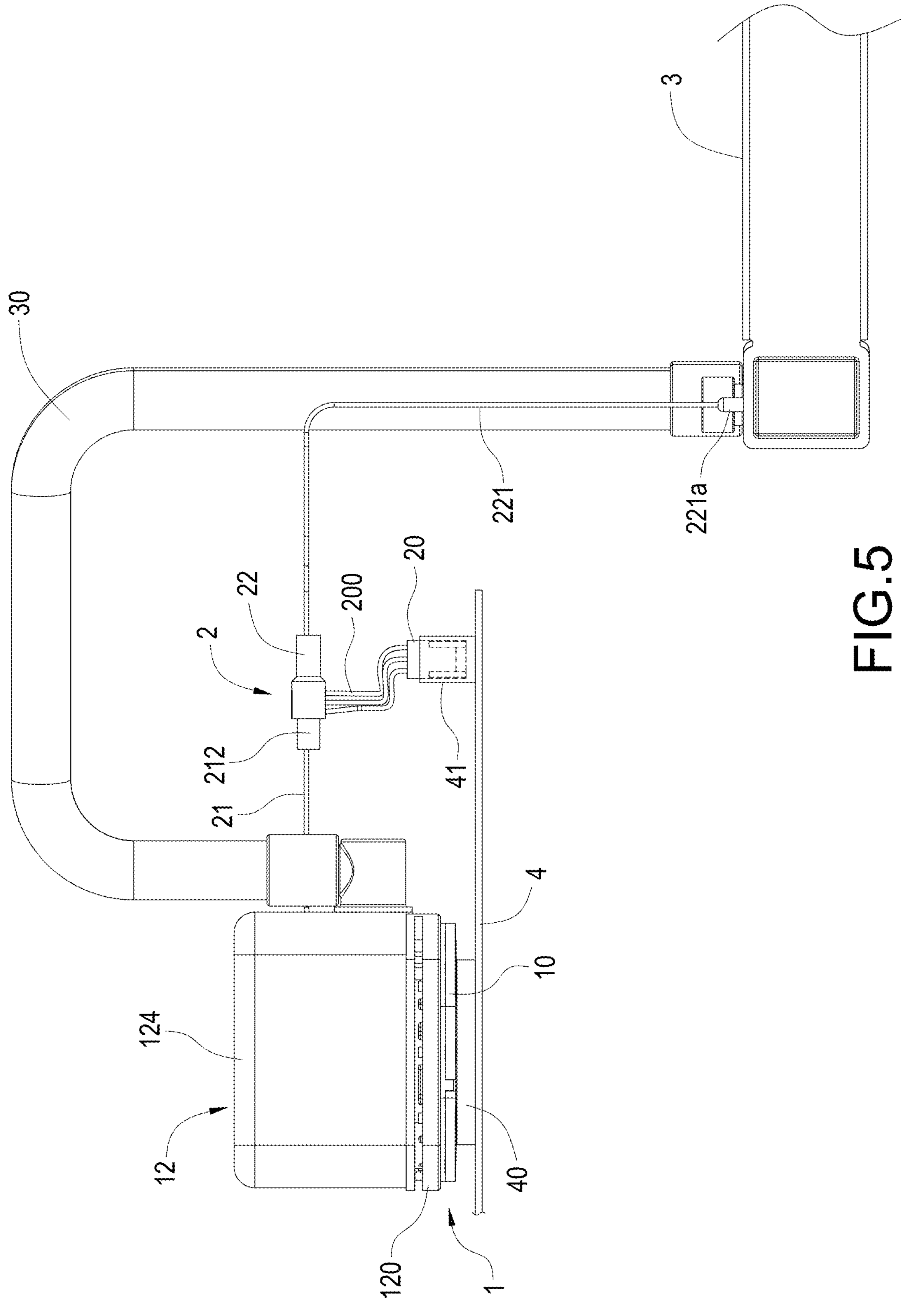
FIG. 5 is a side view of the present disclosure applied to a mainboard.

As shown in FIG. 2 and FIG. 3, the water-cooling head 1 includes a metal base plate 10. The metal base plate 10 includes a heat receiving surface 100 for being attached to a heat source 40 (as shown in FIG. 5) of a mainboard. In addition, the metal base plate 10 includes an accommodation space 101 arranged at an area opposite to the heat receiving surface 100 and recessed therefrom. A plurality of fins 102 are disposed in the accommodation space 101. The metal base plate 10 includes a waterproof layer 11, and the waterproof layer 11 covers the accommodation space 10 and abuts against the fins 102 to form a water-cooling head. The waterproof layer 11 refers to the area attached to the metal base plate 10 and provides the waterproof function. In an exemplary embodiment of the present disclosure, a water pump 12 is further arranged on the water-cooling head 1. The water pump 12 includes a connecting seat 120, an upper cover 121 covering the connecting seat 120, an impeller arranged on the upper cover 121, and a base 123 attached to the upper cover 121 and covering the impeller 122. In addition, one or a plurality of connecting holes 110 are formed on the waterproof layer 11 and connected to the connecting seat 120 to allow the water-cooling head 1 to be fluidly connected to the internal of the water pump 12, thereby allowing a cooling liquid (not shown in the drawings) to flow between the two. Furthermore, the connecting base 120 may further include a protective cover 124 covering the upper cover 121 and the base 123. The protective cover 124 may be made of a transparent or light transmissive material to allow an observer to view the condition of the water pump 12 from the external.

According to the above, the ground cable set 2 includes a ground plug 20 and a ground cable 21, and the ground cable 21 is electrically connected to the ground plug 20. For example, the ground cable 21 may be connected to the ground plug 20, or other transfer line or structure may be installed to bridge between the ground cable 21 and the ground plug 20. The present disclosure mainly allows the ground cable 21 to contact the aforementioned water-cooling head 1. For example, the ground cable 21 may contact the metal base plate 10 arranged at an outer side of the accommodation space 101, and further connection may be made via the ground plug 20 and the system (such as the mainboard 4, or system operation circuit boards of electronic devices and computers as shown in FIG. 5) for ground, such as the ground socket 41 on the mainboard 4. As a result, the residual leakage current on the water-cooling head 1 after contacting the heat source may be guided and grounded. In an exemplary embodiment of the present disclosure, the ground cable 21 includes a conductive pad 210 contacting the water-cooling head 1. The ground cable 21 may pass through the protective cover 124 and extend toward the water-cooling head 1 to allow the conductive pad 210 to be attached to the surface of the water-cooling head 1. Furthermore, the connecting base 120 of the water pump 12 includes a penetrating portion **120*a* protruding outward from an outer side of the base 123. The penetrating portion 120*a* is stacked on the metal base plate 10 of the water-cooling head 1, and the penetrating portion 120*a* includes a through hole 120*b* formed thereon and penetrating to the metal base plate 10 to allow the conductive pad 210 to pass through the through hole 120*b* for contacting the metal base plate 10. In some embodiments, the conductive pad 210 may further include an insertion gasket 211 press-fitted inside the through hole 120*b* to prevent disengagement of the conductive pad 210**.

Figure 4:
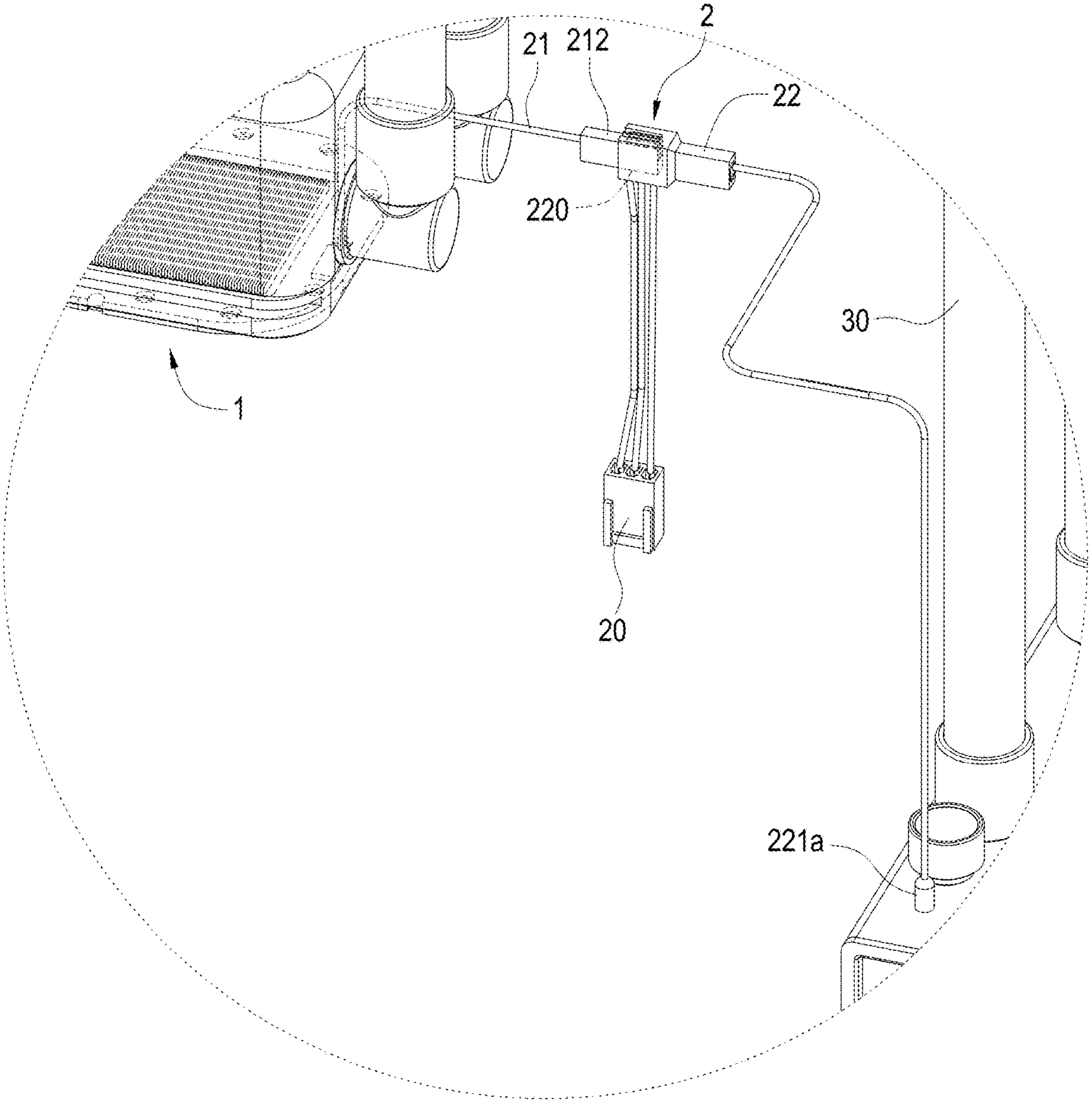
FIG. 4 is a partially enlarged view of FIG. 1.

Please refer to FIG. 1, FIG. 2 and FIG. 4. The present disclosure further includes a radiator 3 to achieve the effect of eliminating electrical charge. The two pipelines 30 of the radiator 3 may be connected to the internal of the water pump 12, and the ground cable set 2 may further include a branch seat 22. The branch seat 22 includes a socket 220 to receive a connector 212 of the ground cable 21 for establishing an electrical connection therebetween. In addition, the branch seat 22 allows the ground plug 20 to be connected thereto with a cable 200, such that an electrical connection is established with the connector 212 inserted into the socket 220. Furthermore, the branch seat 22 further includes an extension cord 221 electrically connected to the cable 200, and the extension cord 221 extends toward the radiator 3 and includes a ground end **221*a* contacting the radiator 3, such that the effect of leakage current guidance and ground may also be achieved for the radiator 3**.

With the aforementioned structure and configuration, the water-cooling head structure capable of guiding a leakage current and the water-cooling device thereof of the present disclosure are achieved.

The above description is provided to illustrate the exemplary embodiments of the present disclosure only such that it shall not be treated as limitation to the claimed scope of the present disclosure. In addition, any equivalent modification made based on the present disclosure shall be considered to be within the claimed scope of the present disclosure.

What is claimed is:

1. A water-cooling head structure, comprising:

a water-cooling head, comprising a metal base plate, the metal base plate comprising an accommodation space recessed therefrom, wherein a plurality of fins is arranged in the accommodation space, and the metal base plate comprises a waterproof layer covering the accommodation space and the plurality of fins;

a ground cable set, comprising a ground plug and a ground cable, and the ground cable electrically connected to the ground plug;

a water pump, comprising a connecting seat, an upper cover covering the connecting seat, an impeller arranged on the upper cover, and a base attached with the upper cover to cover the impeller, wherein one or a plurality of connecting holes is defined on the waterproof layer and communicates to the connecting seat; wherein the connecting seat of the water pump comprises a penetrating portion protruding outward from one side of the base, the penetrating portion is stacked on the metal base plate of the water-cooling head, and the penetrating portion comprises a through hole defined thereon and penetrating to the metal base plate;

wherein the ground cable passes through the through hole and contacts the metal base plate, and the ground plug is electrically connected to ground.

2. The water-cooling head structure capable according to claim 1, wherein the ground cable contacts the metal base plate outside of the accommodation space.

3. The water-cooling head structure capable according to claim 1, wherein the ground cable comprises a conductive pad contacting the water-cooling head.

4. The water-cooling head structure capable according to claim 3, wherein the conductive pad comprises an insertion gasket press-fitted in the through hole.

5. A water-cooling device, comprising:

a water-cooling head, comprising a metal base plate, the metal base plate comprising an accommodation space recessed therefrom, wherein a plurality of fins is arranged in the accommodation space, and the metal base plate comprises a waterproof layer covering the accommodation space and the plurality of fins;

a ground cable set, comprising a ground plug and a ground cable, and the ground cable electrically connected to the ground plug;

a radiator, comprising two pipelines connected between the radiator and the water-cooling head;

a water pump, comprising a connecting seat, an upper cover covering the connecting seat, an impeller arranged on the upper cover, and a base attached with the upper cover to cover the impeller, wherein one or a plurality of connecting holes is defined on the waterproof layer and communicates to the connecting seat, and the two pipelines of the radiator are connected to the water pump; wherein the connecting seat of the water pump comprises a penetrating portion protruding outward from one side of the base, the penetrating portion is stacked on the metal base plate of the water-cooling head, and the penetrating portion comprises a through hole defined thereon and penetrating to the metal base plate;

wherein the ground cable passes through the through hole and contacts the metal base plate, and the ground plug is electrically connected to ground.

6. The water-cooling device according to claim 5, wherein the ground cable contacts the metal base plate outside of the accommodation space.

7. The water-cooling device according to claim 5, wherein the ground cable comprises a conductive pad contacting the water-cooling head.

8. The water-cooling device according to claim 7, wherein the conductive pad comprises an insertion gasket press-fitted in the through hole.

9. The water-cooling device according to claim 5, wherein the ground cable set further comprises a branch seat, the branch seat comprises a socket, the ground cable is inserted to the socket through a connector for electrical connection.

10. The water-cooling device according to claim 9, wherein the ground plug is connected to the branch seat by a cable to be electrically connected with the connector.

11. The water-cooling device according to claim 10, wherein the branch seat comprises an extension cord electrically connected to the cable, and the extension cord comprises a ground end contacting the radiator.

* * * * *